(12) United States Patent
Ten Kate et al.

(10) Patent No.: US 10,372,044 B2
(45) Date of Patent: Aug. 6, 2019

(54) SUBSTRATE TABLE, A LITHOGRAPHIC APPARATUS AND A DEVICE MANUFACTURING METHOD

(71) Applicant: ASML NETHERLANDS B.V., Veldhoven (NL)

(72) Inventors: Nicolaas Ten Kate, Almkerk (NL); Raymond Wilhelmus Louis Lafarre, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/856,133

(22) Filed: Dec. 28, 2017

(65) Prior Publication Data

US 2018/0348650 A1 Dec. 6, 2018

Related U.S. Application Data

(63) Continuation of application No. 15/273,416, filed on Sep. 22, 2016, now Pat. No. 9,857,696, which is a continuation of application No. 15/048,826, filed on Feb. 19, 2016, now Pat. No. 9,454,089, which is a continuation of application No. 14/690,032, filed on Apr. 17, 2015, now Pat. No. 9,268,238, which is a continuation of application No. 13/329,971, filed on Dec. 19, 2011, now Pat. No. 9,013,683.

(60) Provisional application No. 61/425,582, filed on Dec. 21, 2010.

(51) Int. Cl.
*G03F 7/20* (2006.01)

(52) U.S. Cl.
CPC ...... *G03F 7/70716* (2013.01); *G03F 7/70341* (2013.01)

(58) Field of Classification Search
CPC .................. G03F 7/70341; G03F 7/70716
USPC .................................. 355/30, 72
See application file for complete search history.

(56) References Cited

U.S. PATENT DOCUMENTS

| | | |
|---|---|---|
| 4,509,852 A | 4/1985 | Tabarelli et al. |
| 5,572,934 A | 11/1996 | Aldridge et al. |
| 7,253,875 B1 | 8/2007 | Luttikhuis et al. |
| 7,705,968 B2 | 4/2010 | Nagasaka et al. |
| 8,027,019 B2 | 9/2011 | Kemper et al. |
| 9,013,683 B2 | 4/2015 | Ten Kate |
| 9,268,238 B2 | 2/2016 | Ten Kate |
| 9,454,089 B2 | 9/2016 | Ten Kate |
| 9,857,696 B2 * | 1/2018 | Ten Kate ............ G03F 7/70341 |

(Continued)

FOREIGN PATENT DOCUMENTS

| | | |
|---|---|---|
| CN | 101046640 | 10/2007 |
| EP | 1 420 298 | 5/2004 |

(Continued)

OTHER PUBLICATIONS

Yuichi Shibazaki et al., "An innovative platform for high throughput, high-accuracy lithography using a single wafer stage," Proc of SPIE, vol. 7274, pp. 72741I-1-72741I-12

*Primary Examiner* — Colin W Kreutzer
(74) *Attorney, Agent, or Firm* — Pillsbury Winthrop Shaw Pittman, LLP

(57) ABSTRACT

A table for a lithographic apparatus, the table having a catchment opening formed in an upper surface of the table, the catchment opening in fluid communication through the table with the environment of the table at a drain opening in a surface of the table other than the upper surface.

20 Claims, 7 Drawing Sheets

(56) References Cited

U.S. PATENT DOCUMENTS

| | | |
|---|---|---|
| 2002/0057423 A1 | 5/2002 | Nogawa |
| 2004/0207824 A1 | 10/2004 | Lof et al. |
| 2007/0132979 A1 | 6/2007 | Lof et al. |
| 2007/0177119 A1 | 8/2007 | Chiba |
| 2007/0229786 A1 | 10/2007 | Kemper et al. |
| 2007/0288121 A1 | 12/2007 | Shibazaki |
| 2008/0043210 A1 | 2/2008 | Shibuta |
| 2008/0043211 A1 | 2/2008 | Poon et al. |
| 2008/0094592 A1 | 4/2008 | Shibazaki |
| 2008/0192226 A1 | 8/2008 | Shibazaki |
| 2008/0297744 A1 | 12/2008 | De Jong et al. |
| 2009/0033900 A1 | 2/2009 | Kanaya |
| 2009/0208883 A1 | 8/2009 | Nagasaka |
| 2009/0237638 A1 | 9/2009 | Nishikawara et al. |
| 2009/0290135 A1 | 11/2009 | Lof et al. |
| 2010/0003963 A1 | 1/2010 | Aaltonen et al. |
| 2010/0118286 A1 | 5/2010 | Namba |
| 2010/0296068 A1 | 11/2010 | Shibazaki |
| 2011/0001942 A1 | 1/2011 | Lof et al. |
| 2011/0007285 A1 | 1/2011 | Lof et al. |
| 2011/0170077 A1 | 7/2011 | Lof et al. |
| 2011/0242512 A1 | 10/2011 | Kemper et al. |
| 2011/0273678 A1 | 11/2011 | Kemper et al. |
| 2011/0279800 A1 | 11/2011 | Lof et al. |
| 2011/0285977 A1 | 11/2011 | Lof et al. |

FOREIGN PATENT DOCUMENTS

| | | |
|---|---|---|
| EP | 1 61 028 | 3/2006 |
| EP | 1 670 039 | 6/2006 |
| EP | 1 699 073 | 9/2006 |
| EP | 1 788 617 | 5/2007 |
| EP | 1 801 850 | 6/2007 |
| JP | 2007-266603 | 10/2007 |
| JP | 2008-262963 | 10/2008 |
| JP | 2010-003963 | 1/2010 |
| JP | 2011-029545 | 2/2011 |
| JP | 2011-029546 | 2/2011 |
| JP | 2011-222652 | 11/2011 |
| WO | 99/4904 | 9/1999 |
| WO | 2005/059977 | 6/2005 |
| WO | 2009/078443 | 6/2009 |

* cited by examiner

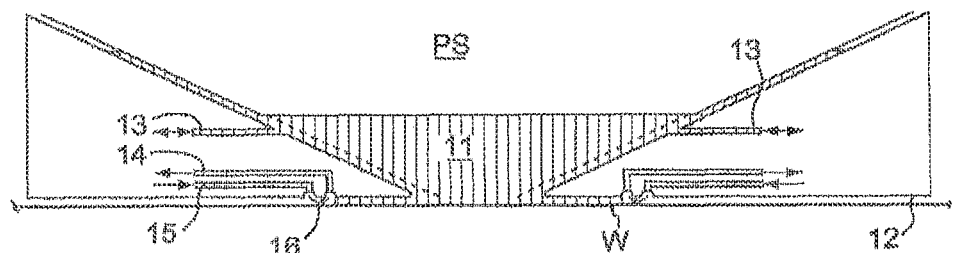
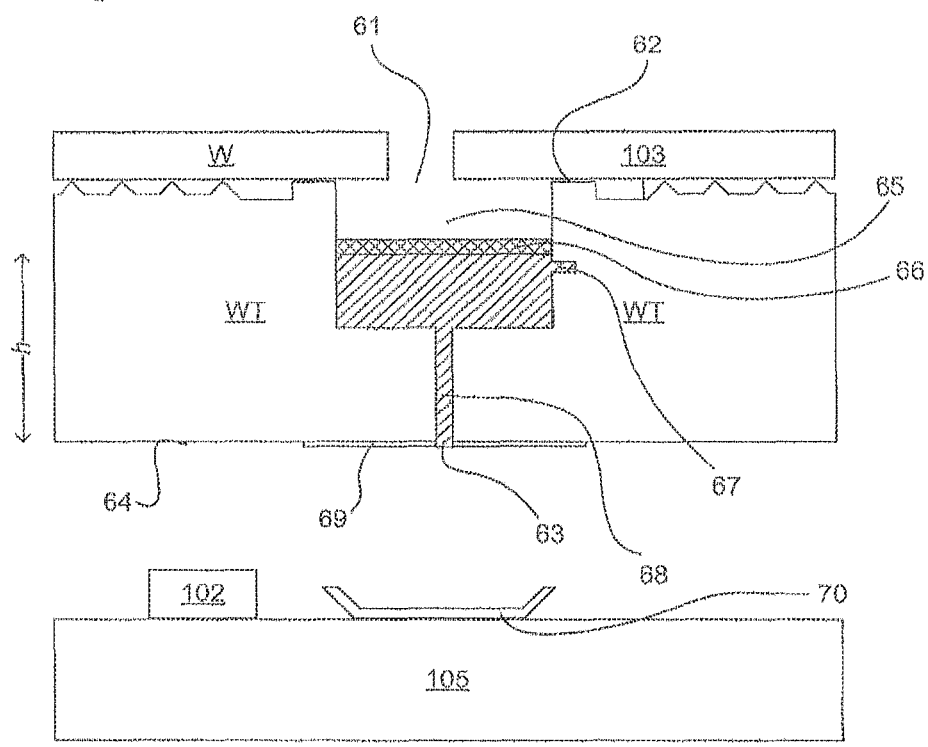

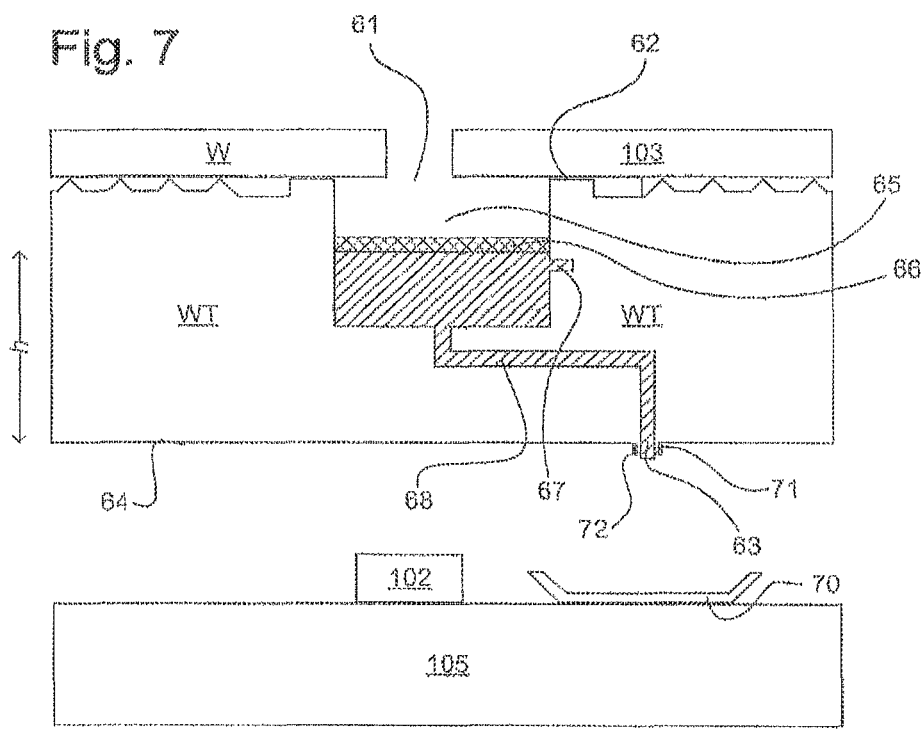
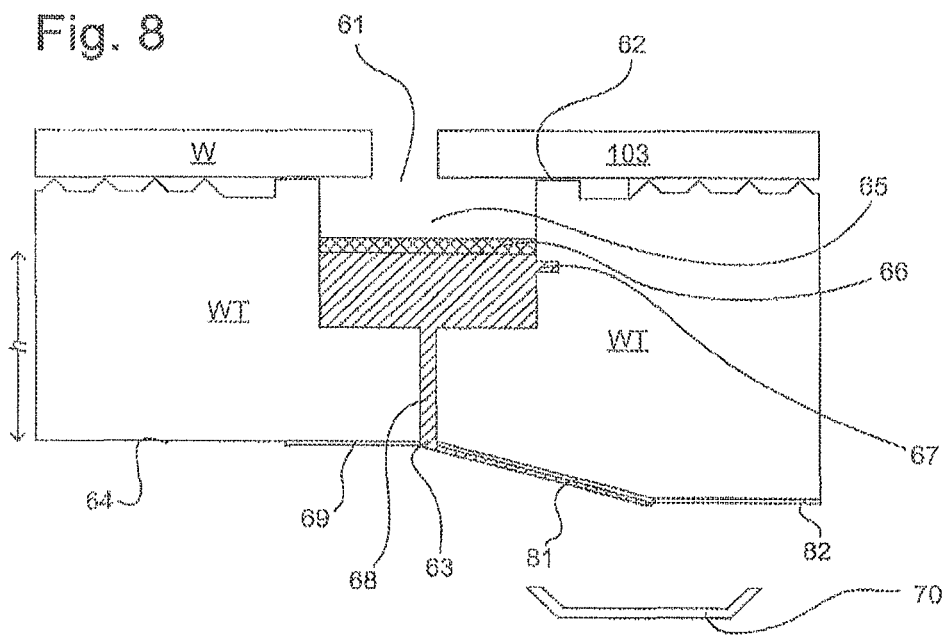

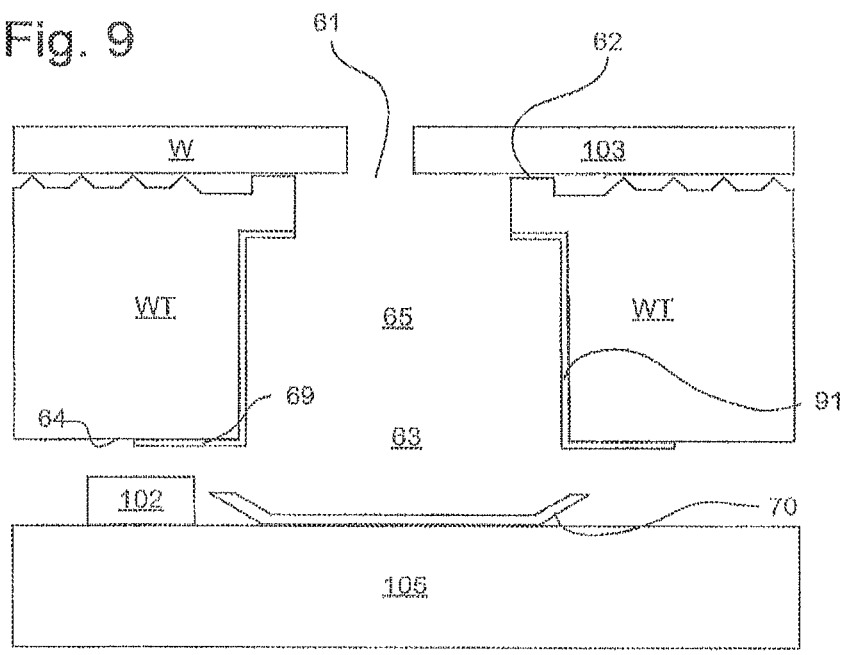
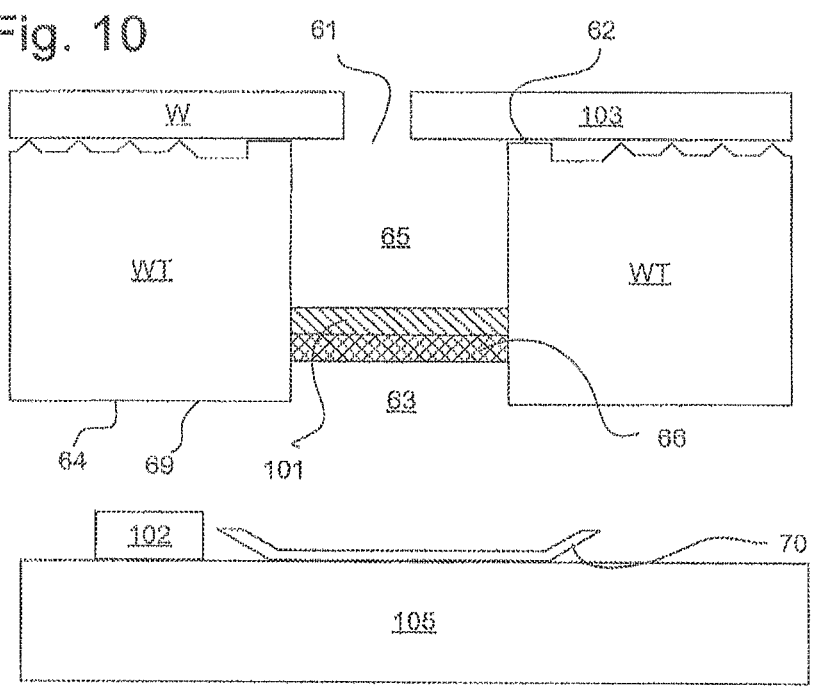

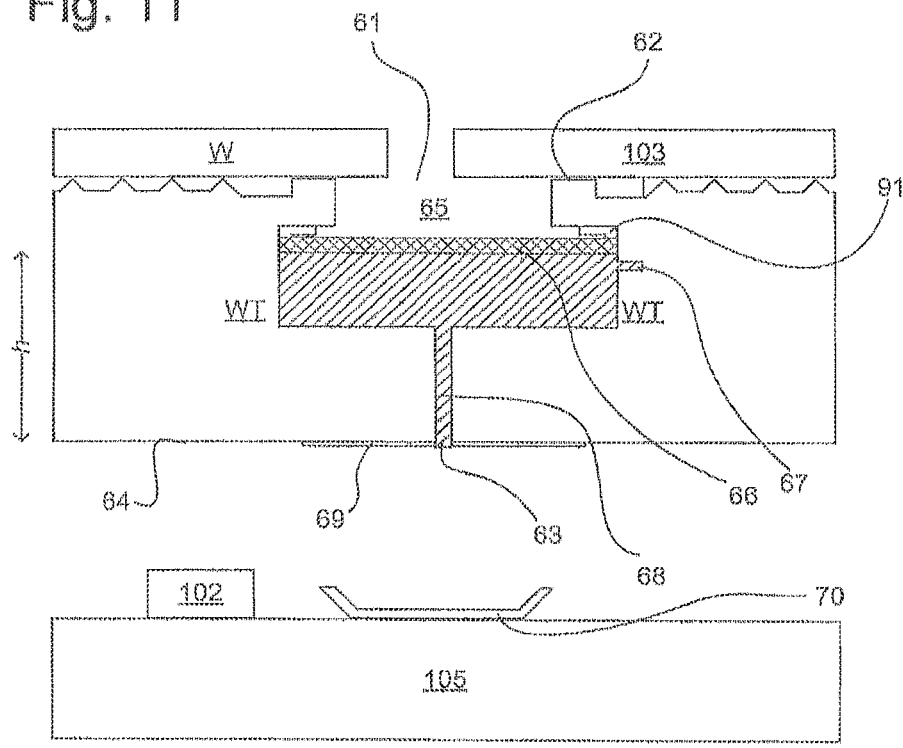
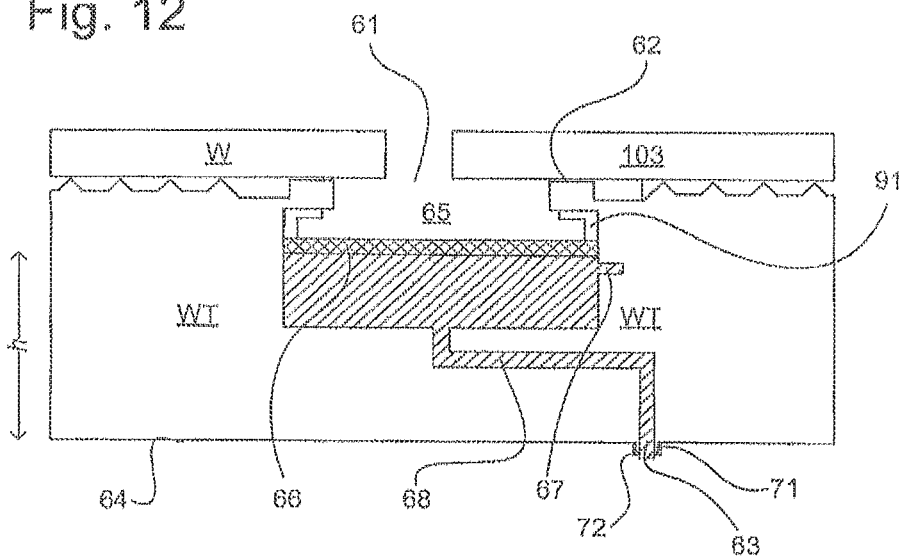

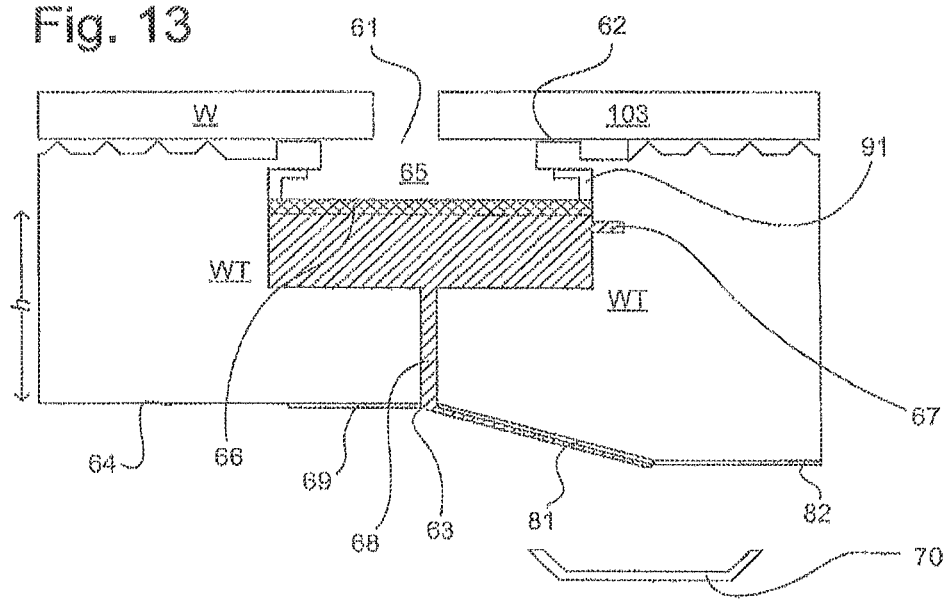
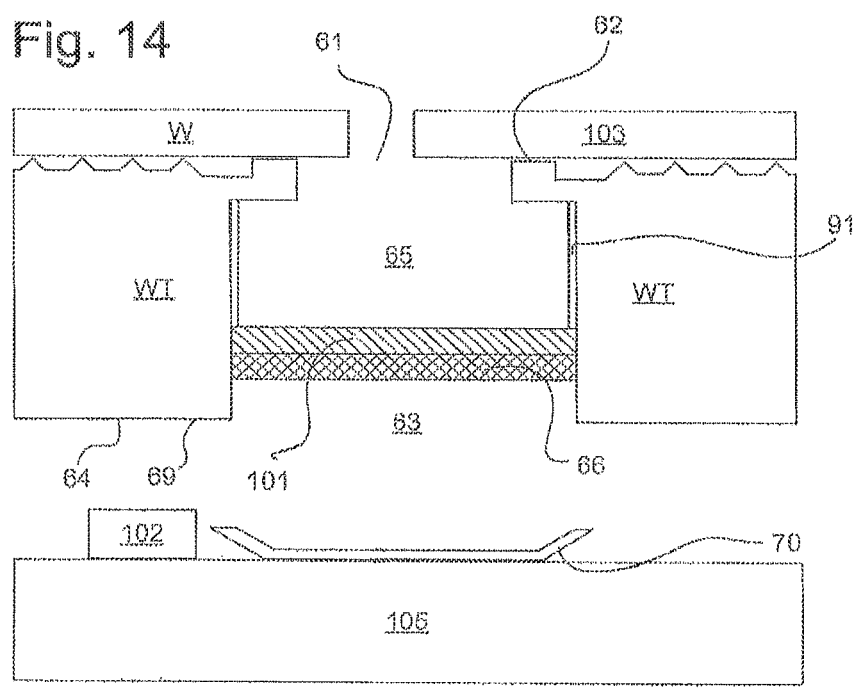

SUBSTRATE TABLE, A LITHOGRAPHIC APPARATUS AND A DEVICE MANUFACTURING METHOD

This application is a continuation of U.S. patent application Ser. No. 15/273,416, filed Sep. 22, 2016, now allowed, which is a continuation of U.S. patent application Ser. No. 15/048,826, filed on Feb. 19, 2016, now U.S. Pat. No. 9,454,089, which is a continuation of U.S. patent application Ser. No. 14/690,032, filed on Apr. 17, 2015, now U.S. Pat. No. 9,268,238, which is a continuation of U.S. patent application Ser. No. 13/329,971, filed on Dec. 19, 2011, now U.S. Pat. No. 9,013,683, which claims priority and benefit under 35 U.S.C. § 119(e) to U.S. Provisional Patent Application No. 61/425,582, filed on Dec. 21, 2010. The entire contents of each of those applications is incorporated herein in by reference.

FIELD

The present invention relates to a table, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus collides with a droplet on the surface, this may result in inclusion of a bubble in the immersion liquid. The droplet may be present on the surface for various reasons, including because of leakage from the fluid handling system. A bubble in immersion liquid can lead to imaging errors, for example by interfering with a projection beam during imaging of the substrate.

One way in which a bubble may be formed is that when the meniscus moves over the edge of the substrate W or other object, gas can get entrapped in the body of liquid, thereby forming a bubble. The gas that forms the bubble may come from the gap between the edge of the substrate W or other object and the section of the table surrounding the substrate W or other object. In order to help prevent bubbles from forming in this way, the table may comprise a two-phase extractor. The two-phase extractor involves drawing gas and, if present, liquid, down through the gap.

It is desirable, for example, to provide a lithographic apparatus in which the likelihood of bubble inclusion is at least reduced.

According to an aspect, there is provided a table for a lithographic apparatus, the table comprising a catchment opening formed in an upper surface of the table, the catchment opening in fluid communication through the table with the environment of the table at a drain opening in a surface of the table other than the upper surface.

According to an aspect, there is provided a lithographic apparatus comprising the table as described above.

According to an aspect, there is provided a device manufacturing method, comprising:

projecting a patterned beam of radiation through an immersion liquid confined to a space between a final element of a projection system and a substrate supported on a substrate table;

catching immersion liquid in a catchment opening formed in an upper surface of a table, the catchment opening in fluid communication through the table with the environment of the table at a drain opening in a surface of the table other than the upper surface; and extracting immersion liquid at the drain opening.

BRIEF DESCRIPTION OF THE DRAWINGS

Embodiments of the invention will now be described, by way of example only, with reference to the accompanying schematic drawings in which corresponding reference symbols indicate corresponding pads, and in which:

FIG. 5 depicts a further liquid supply system for use in a lithographic projection apparatus;

FIG. 6 depicts, in cross-section, a substrate table for use in a lithographic projection apparatus;

FIG. 7 depicts, in cross-section, a substrate table for use in a lithographic projection apparatus;

FIG. 8 depicts, in cross-section, a substrate table for use in a lithographic projection apparatus;

FIG. 9 depicts, in cross-section, a substrate table for use in a lithographic projection apparatus;

FIG. 10 depicts, in cross-section, a substrate table for use in a lithographic projection apparatus;

FIG. 11 depicts, in cross-section, a substrate table for use in a lithographic projection apparatus;

FIG. 12 depicts, in cross-section, a substrate table for use in a lithographic projection apparatus;

FIG. 13 depicts, in cross-section, a substrate table for use in a lithographic projection apparatus; and FIG. 14 depicts, in cross-section, a substrate table for use in a lithographic projection apparatus.

DETAILED DESCRIPTION

Figure 1:
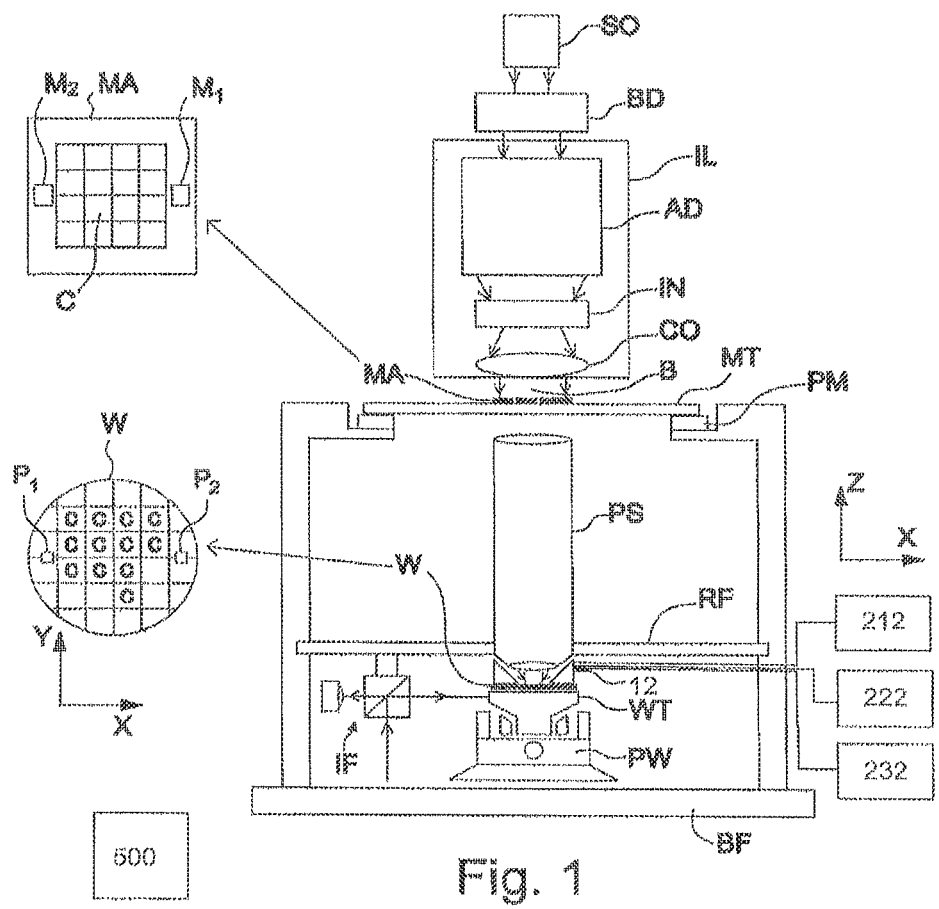
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table WT to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can be used in such a system. However, a sealing feature is not present, not activated, not as efficient as normal or otherwise ineffective to seal liquid to only the localized area.

Figure 2:
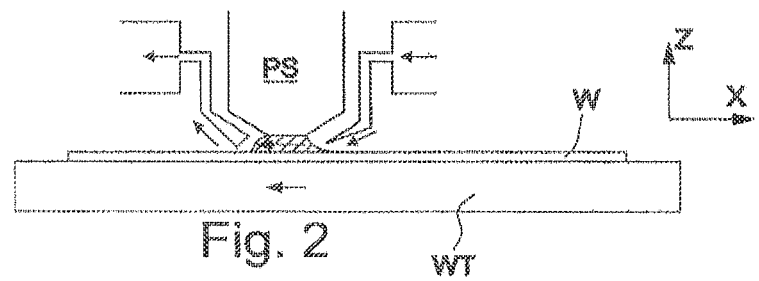
FIGS. 2 and 3 depict a liquid supply system for use in a lithographic projection apparatus.
Figure 3:
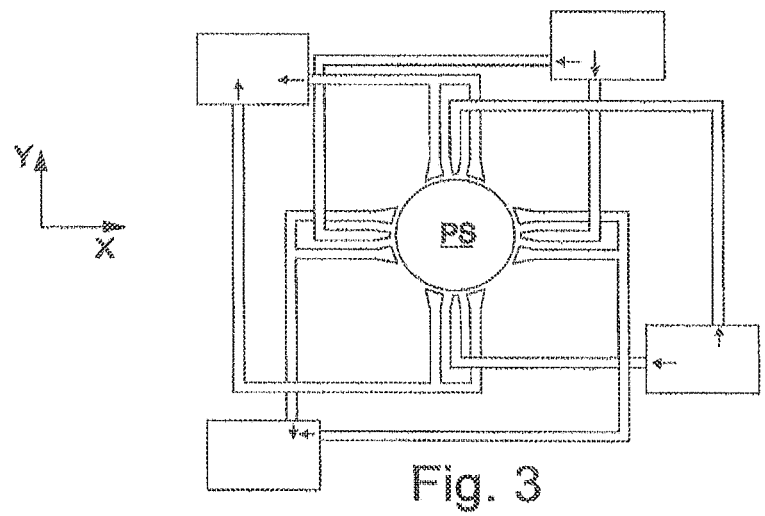

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
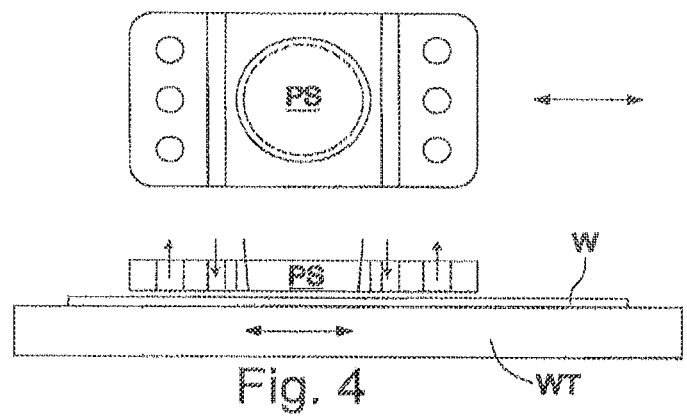
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate IN. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

A control system 500 controls the overall operations of the lithographic apparatus and in particular performs an optimization process described further below. Control system 500 may be embodied as a suitably-programmed general purpose computer comprising a central processing unit, volatile and non-volatile storage means, one or more input and output devices such as a keyboard and/or a screen, one or more network connections and one or more interfaces to the various parts of the lithographic apparatus. It will be appreciated that a one-to-one relationship between controlling computer and lithographic apparatus is not necessary. In an embodiment of the invention one computer may control multiple lithographic apparatuses. In an embodiment of the invention, multiple networked computers may be used to control one lithographic apparatus. The control system 500 may be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

FIG. 6 illustrates, in cross-section, a substrate table WT according to an embodiment of the invention. The substrate table WT comprises a catchment opening 61 formed in an upper surface 62 of the substrate table WT. The catchment opening (or fluid collection opening) 61 is in fluid communication through the substrate table WT with the environment of the substrate table WT at a drain opening 63 in a surface 64 of the substrate table WT other than the upper surface 62. The environment of the substrate table WT is the immediate surroundings of the substrate table WT. The environment is the space immediately external to the substrate table WT. The undersurface 64 of the substrate table WT is in direct contact with the environment of the substrate table WT.

The catchment opening 61, the drain opening 63 and the flow path 65 connecting the catchment opening 61 to the drain opening 63 may form a two-phase extractor. A two-phase extractor extracts a mixture of liquid and gas. By having the catchment opening 61 in fluid communication through the substrate table WT with the environment of the substrate table WT at the drain opening 63 a two-phase extractor that is bottomless is provided. This helps to reduce the thermal deformation of components of the lithographic apparatus. For example, one or more encoder grid plates, which may comprise part of a positioning system to position the substrate table WT, may be mounted on the substrate table WT. U.S. patent application publication no. US 2007-0288121 describes an exemplary lithographic apparatus in which one or more encoder grid plates are on the upper surface 62 of the substrate table WT. One or more encoder sensors may be fixed to a frame above the substrate table WT. By providing a bottomless two-phase extractor, the encoder grid plates are less likely to be thermally deformed due to evaporative cooling. Such evaporated cooling results from the evaporation of droplets of liquid, e.g. immersion liquid, on the surface of the component.

By forming the fluid communication between the catchment opening 61 and the environment of the substrate table WT at the drain opening 63, no cables or hoses need to be connected to the substrate table WT for removal of fluid from the catchment opening 61.

The catchment opening 61 may be used to catch gas and/or liquid from the upper surface of the substrate table assembly. The upper surface of the substrate table assembly may comprise an upper surface of one or more selected from: the substrate W, a sensor, a sticker, a cover plate 103, the substrate table WT and other components of the lithographic apparatus positioned on the substrate table WT. A two-phase mixture of gas and liquid may be caught by the catchment opening 61 into the flow path 65. In an embodiment, only liquid is extracted from the flow path 65 by the drain opening 63. In an embodiment the mixture of gas and liquid is extracted from the flow path 65 through the drain opening 63. The extraction through the drain opening 63 should be done in such a way that substantially no liquid flows into any gaps between the upper surface 62 of the substrate table WT and an undersurface of a component (e.g. cover plate 103) directly above the substrate table WT. In an embodiment, the catchment opening 61 is overhung by the upper surface of the substrate table assembly.

In an embodiment, the surface of the substrate table other than the upper surface is an undersurface 64 of the substrate table WT. Hence, in an embodiment, the drain opening 63 is in the undersurface 64 of the substrate table WT. The drain opening 63 is below the catchment opening 61. This allows immersion liquid to be extracted from the upper surface of the substrate table assembly through the catchment opening 61 and the drain opening 63 using gravity only. In this way, it is not necessary to provide an active extractor. Hence, this system may be termed a passive two-phase extractor.

As depicted in FIG. 6, the substrate table WT may comprise a porous structure 66 in a flow path 65 between the catchment opening 61 and a drain opening 63. The porous structure 66 may comprise a capillary structure. The porous structure 66 may comprise a sieve, or a microsieve. The porous structure 66 is desirably lyophilic. The purpose of the porous structure 66 is to maintain the level of liquid in the flow path 65. In this way, the amount of liquid which falls on the porous structure 66 is directly drained from the drain opening 63. As a result, the volume of liquid in the flow path 65 stays approximately constant.

In an embodiment, the drain opening 63 is in a side surface of the substrate table WT. The drain opening 63 can be in any surface of the substrate table WT provided that the drain opening is positioned directly or indirectly below the catchment opening 61. This allows liquid in the catchment opening 61 to be extracted from the drain opening 63 by only gravity.

The porous structure 66 may comprise a porous medium. A porous medium may be more robust than a microsieve. However, a microsieve has an advantage over the porous medium in that the holes are better defined.

In an embodiment, an upper surface of the porous structure 66 is at least 2 mm below the upper surface 62 of the substrate table WT. In an embodiment, the distance between the upper surface of the porous structure 66 and the upper surface 62 of the substrate table WT is at least 3 mm, at least 4 mm or at least 5 mm. A purpose of the minimum distance of the depth of the flow path above the porous structure 66 is to help prevent immersion liquid from bridging between the fluid handling structure 12 and the porous structure 66. Such bridging involves a continuous body of liquid between the fluid handling structure 12 and the porous structure 66. The liquid confined by the fluid handling structure 12 can form a bridge to the porous structure 66, which may be lyophilic. If such bridging occurs, then this may result in draining the immersion liquid away from the fluid handling structure 12.

A further reason for the minimum distance is to help prevent bridging between the undersurface of the substrate W and the porous structure 66. Such bridging may otherwise lead to liquid entering the gap between the undersurface of the substrate W and the substrate table WT.

When a droplet of liquid lands on the porous structure 66 in the flow path 65, the droplet of liquid will pass through the holes of the porous structure 66 and add to the volume of liquid below the porous structure 66. The resulting reservoir of liquid below the porous structure 66 drains to the drain opening 63 of the substrate table WT.

In an embodiment, the average radius of the pores in the porous structure 66 is in the range of from about 10 micrometers to 100 micrometers. The maximum radius of the pores may be larger, being of the order of 100s micrometers.

Liquid in the flow path 65, such as liquid stored in the porous structure 66, may be lost through evaporation. In order to maintain the level of liquid in the flow path 65, the substrate table WT may comprise a liquid supply opening 67 in the flow path 65 below the porous structure 66. The liquid supply opening 67 is configured to supply liquid to the flow path 65. Hence, there is a passive drip feed of liquid into the reservoir of liquid below the porous structure 66 in order to keep the reservoir below the porous structure 66 substantially full of liquid. The rate of evaporation of liquid from the flow path 65 is likely to be relatively low. Therefore, it may be necessary for only a few drops of liquid to be supplied to the flow path 65 from the liquid supply opening 67 per cycle of exposure of a substrate W. The supply of liquid through the liquid supply opening 67 can be used during startup of the lithographic apparatus in order to fill the reservoir below the porous structure 66.

The supply of liquid through the liquid supply opening 67 could be provided during a substrate swap operation. In an embodiment, the liquid is re-supplied from a reference frame (not shown) when the substrate table WT docks with the reference frame during a table swap operation.

The lithographic apparatus may comprise a controller 500 (depicted in FIG. 1) configured to control a supply of liquid to the flow path 65 between the catchment opening 61 and the drain opening 63 such that liquid is supplied to the flow path 65 during at least one selected from: startup of a lithographic apparatus, a substrate swap operation and/or a docking operation of the substrate table WT to a reference frame of the lithographic apparatus.

The substrate table WT may comprise a liquid level sensor (not shown) configured to monitor the level of liquid in the flow path 65. The liquid level sensor may be connected to the controller 500 to provide the controller with information regarding the level of liquid in the flow path 65. The controller 500 may be configured to control the supply of liquid to the flow path 65 based on the output of the liquid level sensor. In this way, the controller 500 can maintain the level of liquid in the flow path 65.

As depicted in FIG. 6, the catchment opening 61 may be in fluid communication with the environment at the drain opening 63 via at least one capillary tube 68 extending to the drain opening 63. In the embodiment depicted in FIG. 6, the capillary tube 68 extends from the bottom of the reservoir below the porous structure 66 to the drain opening 63. The reservoir of liquid below the porous structure 66 can drain to the bottom of the substrate table WT via the capillary tube 68. In an embodiment, the substrate table WT comprises a series of capillary tubes 68.

FIGS. 9 and 10 depict embodiments in which a capillary tube 68 is not present. In the embodiments depicted in FIGS. 9 and 10, the two-phase extractor is open-ended, with no narrowing of the structure from the catchment opening 61 to the drain opening 63.

In FIG. 6, the reference letter h is used to refer to the distance between the lower surface of the porous structure 66 and the drain opening 63. The distance h is the vertical distance between these two points. In an embodiment, the distance h representing the height of the column of liquid maintained in the flow path 65 is related to a maximum radius of pores of the porous structure 66 by the following equation:

$$\rho g h = \frac{2 \cdot \sigma}{r} \cos\theta,$$

where ρ is the density of immersion liquid, σ is the surface tension of the immersion liquid, r is the maximum radius of pores in the porous structure 66, g is gravity, and θ is the contact angle of the immersion liquid with the porous structure 66.

The capillary tube 68 may have a width within the range of from about 0.2 mm to about 2 mm, desirably within the range of from about 0.5 mm to about 1 mm. As depicted in FIG. 6, a section of the surface 64 of the substrate table WT adjacent the drain opening 63 may be coated with a lyophobic coating 69. As depicted in FIG. 6, the lyophobic coating 69 may substantially surround the drain opening 63. The lyophobic coating 69 may be adjacent the drain opening 63 in the undersurface 64 of the substrate table WT. The purpose of the lyophobic coating 69 is to help prevent the undersurface 64 (or other surface in which the drain opening 63 is positioned) from being wetted by the immersion liquid that is extracted from the drain opening 63. In an embodiment, the lyophobic coating 69 is formed on only one side of the drain opening 63.

As depicted in FIG. 6, the drain opening 63 may be in the undersurface 64 of the substrate table WT directly vertically below the catchment opening 61. This allows the liquid caught in the catchment opening 61 to flow directly to the drain opening 63 from which it can be extracted.

In an embodiment, the porous structure 66 may substantially fill the flow path 65. In an embodiment, the porous structure may substantially fill the section of the flow path from the catchment opening 61 to the top of the capillary tube 68. In this case, the function of the liquid supply opening 67 in the flow path 65 is performed by the porous structure 66. The porous structure 66 may be comprised of capillary material. In this case, the system can be dried out. The first droplets of liquid on the top surface of the porous structure 66 will fill up the porous structure 66 before draining starts.

However, it is possible that a porous structure 66 may become contaminated over time. This can lead to clogging of a porous structure, thereby resulting in a material that is gradually more lyophobic. The porous structure 66 should therefore be cleaned periodically. In an embodiment, the porous structure 66 is detachable from the substrate table WT such that the porous structure 66 can be cleaned while the lithographic apparatus is offline.

In an embodiment, the porous structure 66 is coated in a glass material. A benefit of having a coating of glass material is that the coating of glass material makes the porous structure 66 easier to clean. The glass coating may also improve the lyophobicity of the porous structure 66.

The substrate table WT described above may be comprised in a lithographic apparatus. The lithographic apparatus may further comprise a drip tray 70 below the substrate table WT. The drip tray 70 catches liquid from the drain opening 63. The drip tray 70 is desirably positioned directly vertically below the drain opening 63. The drip tray 70 may be attached to the undersurface 64 of the substrate table WT. The purpose of this is that the drip tray 70 moves automatically along with the substrate table WT such that the relative positions of the drip tray 70 and the drain opening 63 is maintained. In an embodiment, the drip tray 70 is attached to a long-stroke module 105 below the substrate table WT. The long stroke module moves the substrate table WT.

The lithographic apparatus may further comprise an active extractor configured to extract liquid from the drain opening 63. The active extractor may comprise an underpressure generator 102 configured to generate an underpressure in the environment of the drain opening 63. The active extractor may be comprised in a long-stroke module 105 below the substrate table WT. The active extractor removes the liquid from the substrate table WT.

The underpressure generator 102 may be attached to the long-stroke module 105. The underpressure generator 102 may generate a partial vacuum in a region between the substrate table WT and the long-stroke generator 102.

The catchment opening 61 may be positioned radially outward of a substrate W supported on the substrate table WT. A cover plate 103 may be positioned on an upper surface of the substrate table WT radially outward of the substrate W. The catchment opening 61 may be positioned between the substrate W and the cover plate 103.

FIG. 7 depicts, in cross-section, a substrate table WT according to an embodiment of the invention. Components of the substrate table WT depicted in FIG. 7 that are common to the substrate table WT depicted in FIG. 6 are given the same reference numerals. These components may each have the same features described above in relation to the corresponding components depicted in FIG. 6.

As depicted in FIG. 7, the drain opening 63 may be offset from the catchment opening 61. As a result, the drain opening 63 is not directly vertically below the catchment opening 61. This is because the liquid in the two-phase extractor does not have to be drained directly below the catchment opening 61. A benefit of this arrangement is that lateral movement of the substrate table WT (e.g. during a scanning operation) drains liquid from the flow path 65 of the two-phase extractor through the drain opening 63. Hence, both the lateral movement of the substrate table WT and gravity drain liquid from the two-phase extractor.

In the embodiment depicted in FIG. 7, acceleration of the substrate table WT in the horizontal plane (i.e. in the X-direction or in the Y-direction) may lead to liquid draining through the flow path 65 and from the drain opening 63 away from the substrate table WT. As depicted in FIG. 7, the flow path 65 may take the form of a step with a horizontal section between two vertical sections. In an embodiment, the flow path 65 may comprise a diagonal section extending downwards and radially outwards. The section of the flow path 65 that produces the offset of the drain opening 63 from the catchment opening 61 may be comprised of a capillary tube 68.

In an embodiment, the drain opening 63 may comprise a rim 71 that protrudes from the surface 64 of the substrate table WT other than the upper surface 62. As depicted in FIG. 7, the rim 71 may be coated with a lyophobic coating 72. The purpose of the lyophobic coating 72 and the rim 71 is to help prevent the surface 64 of the substrate table WT in which the drain opening 63 is positioned from getting wet. The rim 71 may perform this function either in addition to, or as an alternative to, the lyophobic coating 69 as depicted in FIG. 6.

The embodiment depicted in FIG. 7 may comprise the drip tray 70 described above in relation to the embodiment depicted in FIG. 6. The embodiment depicted in FIG. 7 may comprise the underpressure generator 102 described above in relation to the embodiment depicted in FIG. 6. The underpressure generator may be provided on a long-stroke module 105. The long stroke module 105 may be positioned below the two-phase extractor. The two-phase extractor is contactless with respect to the long-stroke module 105.

FIG. 8 depicts, in cross-section, a substrate table WT according to an embodiment of the invention. Components of the substrate table WT depicted in FIG. 8 that correspond to components depicted in FIG. 6 or FIG. 7 are not described in detail. These components are given the same reference numerals and they may have the same features as described above.

As depicted in FIG. 8, a section of the surface 64 of the substrate table WT other than the upper surface 62 at only one side of the drain opening 63 may be coated with a lyophilic coating 81. The purpose of the lyophilic coating 81 is to transport the liquid from the drain opening 63 away from a position directly under the two-phase extractor. By use of the lyophilic coating 81, the liquid from the drain opening 63 may follow the lyophilic coating 81 and subsequently drip where it meets a lyophobic surface and/or a kink in the surface 64.

In an embodiment, a section of the surface 64 on the other side of the drain opening 63 from the lyophilic coating 81 is coated with a lyophobic coating 69. The lyophobic coating 69 may be radially inwards of the drain opening 63. The lyophilic coating 81 may be radially outwards of the drain opening 63.

In an embodiment, at the point where the drain opening 63 meets the lyophilic coating 81, the surface is smooth to help avoid pinning of the liquid. The surface at this point is desirably rounded, rather than forming a sharp edge.

In an embodiment, the surface 64 radially outwards of the lyophilic coating 81 is coated with a further lyophobic coating 82. The purpose of the further lyophobic coating 82 is to facilitate the liquid following the lyophilic coating 81 forming droplets that drip away from the substrate table WT. A drip tray 70 as described above may catch the droplets.

In an embodiment, a section of the surface 64 of the substrate table WT in which the drain opening 63 is positioned slopes downwards away from the drain opening 63 at one side of the drain opening 63. As depicted in FIG. 8, the downward sloping section of the surface 64 may be the section of the surface on which the lyophilic coating 81 is applied. A purpose of the downward slope is to encourage the draining of liquid away from the drain opening 63 along the lyophilic coating 81 towards the point at which it can drip away from the substrate table WT.

An advantage of this arrangement is that no external tubes may need to be attached to the substrate table WT to extract fluid from a gap at the outer edge of the substrate W. Furthermore, evaporative cooling of components of the lithographic apparatus may be reduced or minimized because substantially only liquid is drawn through the two-phase extractor without significant gas being drawn in. The minimization of evaporative cooling is significant to, for example, a system in which an encoder grid plate and/or sensor is mounted on the upper surface 62 of the substrate table WT. Such an encoder grid plate may be made of quartz for example.

FIG. 9 depicts, in cross-section, a substrate table WT according to an embodiment of the invention. As depicted in FIG. 9, the width of the drain opening 63 may be greater than or equal to the width of the catchment opening 61. Hence, the two-phase extractor is open-ended at the bottom. The drain opening 63 is formed in the undersurface 64 of the substrate table WT. The substrate table WT depicted in FIG. 9 has an advantage of having a simple construction. As depicted in FIG. 9, a width of the flow path 65 between the catchment opening 61 and the drain opening 63 may be greater than the width of the catchment opening 61.

An inner surface of the flow path 65 may be coated with a lyophobic coating 91. The lyophobic coating 91 may form a continuous lyophobic coating with the lyophobic coating 69 that is formed surrounding the drain opening 63.

The embodiment depicted in FIG. 9 may comprise the drip tray 70 described above in relation to the embodiment depicted in FIG. 6. The embodiment depicted in FIG. 9 may comprise the underpressure generator 102 described above in relation to the embodiment depicted in FIG. 6. The underpressure generator may be provided on a long-stroke module 105. The long stroke module 105 may be positioned below the two-phase extractor. The two-phase extractor is contactless with respect to the long-stroke module 105.

FIG. 10 depicts, in cross-section, a substrate table WT according to an embodiment of the invention. As depicted in FIG. 10, the substrate table WT may comprise a sponge-like material 101 in the flow path 65 above the porous structure 66. The purpose of the sponge-like material 101 on top of the porous structure 66 is to increase the flow resistance of liquid that may accumulate at this point. This helps prevent the liquid from sloshing, which would otherwise result in undesirable dynamical forces. In an embodiment, the spongelike material 101 comprises a sponge. The sponge-like material 101 may have a minimum pore size of greater than about 3 mm. In an embodiment, the sponge-like material 101 is non-capillary. A benefit of non-capillary sponge-like material is that the resistance to liquid flow above the porous structure 66 is increased. This reduces undesirable dynamical forces that may otherwise interfere with the movement of the substrate table WT.

As depicted in FIG. 10, the porous structure 66 may be positioned at the bottom end of the two-phase extractor. The porous structure 66 may be positioned in the drain opening 63. The porous structure 66 accumulates excess liquid above it and drips the liquid away from the substrate table WT at a controlled rate. The amount of liquid stored in the porous structure 66 determines the amount of liquid that is extracted through the porous structure 66. The extraction may be passive, i.e. by only gravity. The level of liquid on top of the porous structure 66 may determine the draining rate.

In an embodiment, the side wall of the flow path 65 between the catchment opening 61 and the drain opening 63 is substantially vertical from the upper surface 62 of the substrate table WT to the drain opening 63 in the undersurface 64 of the substrate table WT. This provides a substrate table WT of simple construction.

The embodiment depicted in FIG. 10 may comprise the drip tray 70 described above in relation to the embodiment depicted in FIG. 6. The embodiment depicted in FIG. 10 may comprise the underpressure generator 102 described above in relation to the embodiment depicted in FIG. 6. The underpressure generator may be provided on a long-stroke module 105. The long stroke module 105 may be positioned below the two-phase extractor. The two-phase extractor is contactless with respect to the long-stroke module 105.

As will be appreciated, any of the above-described features can be used with any other feature and it is not only those combinations explicitly described which are covered in this application. For example, the feature of the wider gap in the flow path 65 and optionally the lyophobic coating 91 on the inner surface of the flow path 65 depicted in FIG. 9 may be applied to any of the embodiments depicted in FIG. 6 to 8 or 10. Such embodiments are depicted in FIGS. 11 to 14.

FIG. 11 depicts an embodiment in which the wider gap and optionally lyophobic coating 91 depicted in FIG. 9 are applied to the embodiment depicted in FIG. 6. FIGS. 12, 13 and 14 correspond to embodiments of the invention in which the wider gap and optionally the lyophobic coating 91 depicted in FIG. 9 are applied to the embodiments depicted in FIGS. 7, 8 and 10 respectively.

The embodiments depicted in FIGS. 11-14 may comprise the drip tray 70 described above in relation to the embodiment depicted in FIG. 6. The embodiments depicted in FIGS. 11-14 may comprise the underpressure generator 102 described above in relation to the embodiment depicted in FIG. 6. The underpressure generator may be provided on a long-stroke module 10. The long stroke module 105 may be positioned below the two-phase extractor. The two-phase extractor is contactless with respect to the long-stroke module 105.

While the description herein has described embodiments in respect of a substrate table, an embodiment of the invention may be applied to any table. For example, in addition to or alternatively from a substrate table, an embodiment of the invention may be applied to a measurement table having one or more sensors but not necessarily arranged to hold a substrate.

In an embodiment, there is provide a table for a lithographic apparatus, the table comprising a catchment opening formed in an upper surface of the table, the catchment opening in fluid communication through the table with the environment of the table at a drain opening in a surface of the table other than the upper surface.

In an embodiment, the surface of the table other than the upper surface is an undersurface of the table. In an embodiment, the table further comprises a porous structure in a flow path between the catchment opening and the drain opening. In an embodiment, the maximum radius of the pores in the porous structure is in the range of from about 10 μm to 100 μm. In an embodiment, the table further comprises a liquid supply opening, in the flow path below the porous structure, to supply liquid to the flow path. In an embodiment, the table further comprises a sponge-like material in the flow path above the porous structure. In an embodiment, the average pore size of the sponge-like material is greater than about 3 mm. In an embodiment, the porous structure substantially fills the flow path. In an embodiment, the catchment opening is in fluid communication with the environment at the drain opening via a capillary tube extending to the drain opening. In an embodiment, the average radius of the capillary tube is in the range of from about 0.2 mm to about 2 mm or in the range of from about 0.5 mm to about 1 mm. In an embodiment, the width of the drain opening is greater than or equal to the width of the catchment opening. In an embodiment, a side wall of a flow path between the catchment opening and the drain opening is substantially vertical from the upper surface of the table to the drain opening in an undersurface of the table. In an embodiment, a section of the surface of the table other than the upper surface adjacent the drain opening is coated with a lyophobic coating. In an embodiment, the drain opening is in an undersurface of the table directly vertically below the catchment opening. In an embodiment, the drain opening is offset from the catchment opening. In an embodiment, the drain opening comprises a rim that protrudes from the surface of the table other than the upper surface. In an embodiment, the rim is coated with a lyophobic coating. In an embodiment, a section of the surface of the table other than the upper surface at only one side of the drain opening is coated with a lyophilic coating. In an embodiment, a section of the surface of the table other than the upper surface at one side of the drain opening slopes downwards away from the drain opening. In an embodiment, a width of a flow path between the catchment opening and the drain opening is greater than a width of the catchment opening. In an embodiment, the catchment opening is radially outward of a substrate supporting area on which a substrate is to be supported.

In an embodiment, there is provided a lithographic apparatus comprising the table as described herein. In an embodiment, the lithographic apparatus further comprises a controller configured to control a supply of liquid to a flow path between the catchment opening and the drain opening such that liquid is supplied to the flow path during at least one selected from: startup of the lithographic apparatus, a substrate swap operation and/or a docking operation of the table to a reference frame of the lithographic apparatus. In an embodiment, the lithographic apparatus further comprises a drip tray, below the table, to catch liquid from the drain opening. In an embodiment, the lithographic apparatus further comprises an active extractor configured to extract liquid from the drain opening. In an embodiment, the active extractor comprises an underpressure generator configured to generate an underpressure in the environment of the drain opening. In an embodiment, the lithographic apparatus further comprises a long-stroke module, below the table, to position the table, the long-stroke module comprising the active extractor.

In an embodiment, there is provided a device manufacturing method, comprising: projecting a patterned beam of radiation through an immersion liquid confined to a space between a projection system and a substrate supported on a substrate table; catching immersion liquid in a catchment opening formed in an upper surface of a table, the catchment opening in fluid communication through the table with the environment of the table at a drain opening in a surface of the table other than the upper surface; and extracting immersion liquid at the drain opening.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine-readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two-phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A table for a lithographic apparatus, the table comprising:
   a support region having a protrusion to support to an object;
   a catchment opening arranged to receive liquid that passes through a gap between the object, when supported on the support region, and an outer structure of the table;
   a drain opening configured to receive liquid that passes through the catchment opening;
   a protruding structure protruding from a surface of the table, the protruding structure configured to substantially prevent liquid in the passage from entering a space between the object and/or outer structure, when supported on the table, and a part of the table, wherein the protruding structure defines at least in part the catchment opening;

a passage that extends from the catchment opening to below the surface and terminates at the drain opening, the passage having a uniform width from the catchment opening to the termination at the drain opening; and a porous structure in the passage to receive liquid that passes through the gap.

2. The table of claim 1, wherein the outer structure comprises a plate removably supported on a protrusion of the table.

3. The table of claim 2, wherein the plate covers over at least part of the width of the catchment opening.

4. The table of claim 2, comprising a protruding structure configured to substantially prevent liquid in the passage from entering a space between the plate, when supported on the table, and a part of the table.

5. The table of claim 1, wherein the drain opening has a smaller width than the width of the passage.

6. The table of claim 1, wherein the porous structure is configured to stop liquid flow and accumulate liquid above the porous structure.

7. The table of claim 1, further comprising an underpressure generator configured to generate an underpressure at the drain opening.

8. A lithographic apparatus, comprising:
a projection system configured to project a beam of radiation through a liquid onto a substrate;
a liquid supply system configured to supply a liquid to a region between the projection system and the substrate;
the table of claim 1.

9. A table for a lithographic apparatus, the table comprising:
a support region having a protrusion to support to an object;
a catchment opening arranged to receive liquid that passes through a gap between the object, when supported on the support region, and a plate removably mounted on an upper surface of the table;
a drain opening configured to receive liquid that passes through the catchment opening;
a protruding structure protruding from a surface of the table, the protruding structure configured to substantially prevent liquid in the passage from entering a space between the object and/or plate, when supported on the table, and a part of the table, wherein the protruding structure defines at least in part the catchment opening;
a passage that extends from the catchment opening to below the surface and terminates at the drain opening, the passage having a uniform width from the catchment opening to the termination at the drain opening; and a porous structure to receive liquid that passes through the gap, the porous structure having an upper surface lower than a bottom surface of the object, when supported on the support region.

10. The table of claim 9, wherein the plate is removably supported on a protrusion of the table.

11. The table of claim 9, wherein the plate covers over at least part of the width of the catchment opening.

12. The table of claim 9, wherein the drain opening has a smaller width than the width of the passage.

13. The table of claim 9, wherein the porous structure is configured to stop liquid flow and accumulate liquid above the porous structure.

14. The table of claim 9, further comprising an underpressure generator configured to generate an underpressure at the drain opening.

15. A lithographic apparatus, comprising:
a projection system configured to project a beam of radiation through a liquid onto a substrate;
a liquid supply system configured to supply a liquid to a region between the projection system and the substrate;
the table of claim 9.

16. A table for a lithographic apparatus, the table comprising:
a catchment opening defined in a surface of the table, the catchment opening arranged to receive liquid that passes through a gap between the object, when supported on the table, and an outer structure of the table;
a protruding structure configured to substantially prevent liquid from the catchment opening from entering a space between the object and/or outer structure, when supported on the table, and a part of the table;
a porous structure to receive liquid that passes through the gap, the porous structure configured to stop liquid flow and accumulate liquid above the porous structure; and
a drain opening configured to receive liquid that passes through the catchment opening.

17. The table of claim 16, wherein the outer structure comprises a plate removably supported on a protrusion of the table and the plate covers over at least part of the width of the catchment opening.

18. A lithographic apparatus, comprising:
a projection system configured to project a beam of radiation through a liquid onto a substrate;
a liquid supply system configured to supply a liquid to a region between the projection system and the substrate;
the table of claim 16.

19. The table of claim 1, wherein the drain opening has a smaller cross-sectional dimension that the gap.

20. The table of claim 9, wherein the drain opening has a smaller cross-sectional dimension that the gap.

* * * * *

UNITED STATES PATENT AND TRADEMARK OFFICE
CERTIFICATE OF CORRECTION

PATENT NO. : 10,372,044 B2  
APPLICATION NO. : 15/856133  
DATED : August 6, 2019  
INVENTOR(S) : Nicolaas Ten Kate et al.

Page 1 of 1

It is certified that error appears in the above-identified patent and that said Letters Patent is hereby corrected as shown below:

On the Title Page

On page 2, item (56) Reference Documents:
Please correct "EP 1 61 028 03/2006" to "EP 1 641 028 03/2006" in the FOREIGN PATENT DOCUMENTS.

Signed and Sealed this
Twenty-sixth Day of November, 2019

Andrei Iancu
*Director of the United States Patent and Trademark Office*